United States Patent
Tapen et al.

(10) Patent No.: US 12,401,337 B2
(45) Date of Patent: Aug. 26, 2025

(54) TUNABLE RESONATOR

(71) Applicant: CORNELL UNIVERSITY, Ithaca, NY (US)

(72) Inventors: Thomas P. Tapen, Ithaca, NY (US); Alyssa B. Apsel, Ithaca, NY (US)

(73) Assignee: CORNELL UNIVERSITY, Ithaca, NY (US)

( * ) Notice: Subject to any disclaimer, the term of this patent is extended or adjusted under 35 U.S.C. 154(b) by 233 days.

(21) Appl. No.: 18/015,059

(22) PCT Filed: Jul. 13, 2021

(86) PCT No.: PCT/US2021/041475
§ 371 (c)(1),
(2) Date: Jan. 7, 2023

(87) PCT Pub. No.: WO2022/015758
PCT Pub. Date: Jan. 20, 2022

(65) Prior Publication Data
US 2023/0261628 A1    Aug. 17, 2023

Related U.S. Application Data

(60) Provisional application No. 63/051,799, filed on Jul. 14, 2020.

(51) Int. Cl.
H03H 7/12 (2006.01)
H03H 7/01 (2006.01)
H03H 9/70 (2006.01)

(52) U.S. Cl.
CPC ............ *H03H 7/12* (2013.01); *H03H 7/0153* (2013.01); *H03H 7/1758* (2013.01); *H03H 9/70* (2013.01)

(58) Field of Classification Search
CPC ....... H03H 7/0153; H03H 7/1758; H03H 7/12
(Continued)

(56) References Cited

U.S. PATENT DOCUMENTS 3,110,004 A    11/1963  Pope
3,522,556 A     8/1970  Ragan
(Continued)

FOREIGN PATENT DOCUMENTS

WO    2007138133 A1    12/2007

OTHER PUBLICATIONS

Gu et al., "A frequency selective microstrip line using compensated spiral compact microstrip resonant cells (C-SCMRC)," 2005 Asia-Pacific Microwave Conference Proceedings, Suzhou, China, 2005, 3 pp., doi: 10.1109/APMC.2005.1606548.

(Continued)

*Primary Examiner* — Rakesh B Patel
(74) *Attorney, Agent, or Firm* — MARSHALL, GERSTEIN & BORUN LLP

(57) ABSTRACT

Systems and methods herein provide for a tunable resonator. In one embodiment, a tunable resonator includes a transmission line comprising at least two inductor segments and a tap between each of the at least two inductor segments. The resonator also includes one less switch than a number of the at least two inductor segments on the transmission line. Each switch is coupled to one of the taps. And, each switch is operable to decouple at least one of the at least two inductor segments in the transmission line by shunting at least a portion of the transmission line to ground to change a resonant frequency of the transmission line.

21 Claims, 13 Drawing Sheets

(58) Field of Classification Search
USPC .................. 333/101, 175, 176, 258, 262
See application file for complete search history.

(56) References Cited

U.S. PATENT DOCUMENTS

| | | | |
|---|---|---|---|
| 4,338,582 | A | 7/1982 | Presser |
| 5,180,998 | A | 1/1993 | Willems |
| 7,212,960 | B2 * | 5/2007 | Quint .................. G06F 30/367 |
| | | | 333/117 |
| 7,389,053 | B1 | 6/2008 | Ilchenko et al. |
| 8,698,570 | B2 | 4/2014 | Afshari et al. |
| 9,160,289 | B2 | 10/2015 | Aust |
| 10,147,530 | B2 | 12/2018 | Bojer |
| 10,263,564 | B2 | 4/2019 | Lin et al. |
| 10,498,290 | B2 | 12/2019 | Issakov et al. |
| 2015/0214985 | A1 | 7/2015 | Lee et al. |
| 2016/0336914 | A1 | 11/2016 | Wang et al. |
| 2018/0131368 | A1 | 5/2018 | Lu et al. |
| 2019/0388000 | A1 | 12/2019 | Costantine et al. |
| 2020/0059219 | A1 * | 2/2020 | El-Hinnawy ........ H10N 70/231 |

OTHER PUBLICATIONS

Ghaffarian et al., "Wide-b-and circularly polarised slot antenna by using artificial transmission line," IET Microw. Antennas Propag., 2017, vol. 11 (5), pp. 672-679.
International Searching Authority (ISA/US), Written Opinion, issued in PCT/US2021/041475, dated Oct. 21, 2021.
International Searching Authority (ISA/US), International Search Report, issued in PCT/US2021/041475, dated Oct. 21, 2021.
Tapen et al., "A 3.1-51GHz, Sub-8mW, Single-Core LC VCO Based on a Novel Compact Tunable Transmission Line (CTTL) Resonator in 28nm FDSOI CMOS," 2021 IEEE Radio Frequency Integrated Circuits Symposium (RFIC), Atlanta, GA, USA, 2021, pp. 191-194, doi: 10.1109/RFIC51843.2021.9490503.
Tapen et al., "A Low Power, 3.5-20GHz Tunable LNA with Out-Of-Band Blocker Filtering Based on Compact, Tunable Transmission Line (CTTL) Resonators in 65nm CMOS," ESSCIRC 2021—IEEE 47th European Solid State Circuits Conference (ESSCIRC), Grenoble, France, 2021, pp. 191-194, doi: 10.1109/ESSCIRC53450.2021.9567795.
Extended European Search Report issued in EP 21842024.8, mailing date of Aug. 8, 2024.
Del Rio et al., "Variable-length Transmission Lines for Self-Healing Systems and Reconfigurable Millimeter-Wave Integrated Circuits", *2017 32nd Conference on Design Circuits and Integrated Systems (DCIS)*, 1-5 (2017).
Peroulis et al., "Tunable Lumped Components with Applications to Reconfigurable Mems Filters", *2001 IEEE MTT-S International Microwave Symposium Digest*, 341-344 (2001).

* cited by examiner

TUNABLE RESONATOR

CROSS REFERENCE TO RELATED APPLICATIONS

This patent application is a U.S. National Phase filing under 35 U.S.C. § 371 of International Application No. PCT/US2021/041475, filed Jul. 13, 2021, and published as WO 2022/015758-A1 on Jan. 20, 2022, which claims priority to, and thus the benefit of an earlier filing date from, U.S. Provisional Patent Application No. 63/051,799, filed Jul. 14, 2020, the entire contents of which are hereby incorporated by reference.

BACKGROUND

Conventional wireless communication hardware and sensing hardware often rely on narrowband resonance to improve transceiver performance in a specific frequency band of interest. These resonances can be realized through mechanical and/or acoustic techniques (e.g., using Surface Acoustic Wave—"SAW"-filters, Bulk Acoustic Wave—"BAW"-filters, piezoelectrics, micro-electromechanical systems—"MEMS", etc.), or through electrical techniques (e.g., using active and/or passive inductor-capacitor—"LC"-tank circuits, transmission line resonators, etc.). Generally though, the band of usable resonant frequencies is limited to one octave of tuning or less during design (e.g., the tuning range of conventional wireless hardware systems). As wireless standards continue to proliferate in a myriad of frequency bands, this limited tuning range precludes the design of true multi-standard radios.

Some tunable radio frequency (RF) resonators have been or are being developed to overcome such problems. However, these resonators also have their own problems. For example, in some instances, multiple copies of wireless hardware are controlled by software that selects which path is active. But, complexity arises for each standard implemented as they are often wasteful in terms of circuit area and they are relatively expensive. Ultra-Wideband (UBW) hardware does not require resonators but they are not possible at millimeter-wave (MMW) frequencies and are therefore not suitable for 5G wireless. UBW hardware is also susceptible to interference from other frequencies due to its relatively wide bandwidth. Distributed duplexing, which is currently being researched, has a relatively high power consumption unless relatively poor receiver sensitivity is deemed acceptable as a trade-off. And, large non-integrated systems are not suitable for mobile platforms, such as cell phones, drones, laptops, etc., because of the size. These systems also have higher power consumptions than other techniques.

SUMMARY

Systems and methods presented herein provide a tunable resonator. In one embodiment, a tunable resonator includes a transmission line comprising at least two inductor segments and a tap between each of the at least two inductor segments. The resonator also includes one less switch than a number of the at least two inductor segments on the transmission line. Each switch is coupled to one of the taps. And, each switch is operable to decouple at least one of the at least two inductor segments in the transmission line by shunting at least a portion of the transmission line to ground to change a resonant frequency of the transmission line. Thus, the embodiments herein provide a widely tunable resonator through the use of a compact artificial transmission line that is tunable over much more than an octave of frequency (e.g., more than 1 decade of tuning range). The embodiments provide the benefits of resonance-based wireless hardware design, while adding tunability and overcoming the problems associated with previous techniques.

The various embodiments disclosed herein may be implemented in a variety of ways as a matter of design choice. For example, some embodiments herein are implemented in hardware whereas other embodiments may include processes that are operable to implement and/or operate the hardware. Other exemplary embodiments, including software and firmware, are described below.

BRIEF DESCRIPTION OF THE FIGURES

Some embodiments of the present invention are now described, by way of example only, and with reference to the accompanying drawings. The same reference number represents the same element or the same type of element on all drawings.

DETAILED DESCRIPTION OF THE FIGURES

Figure 1A:
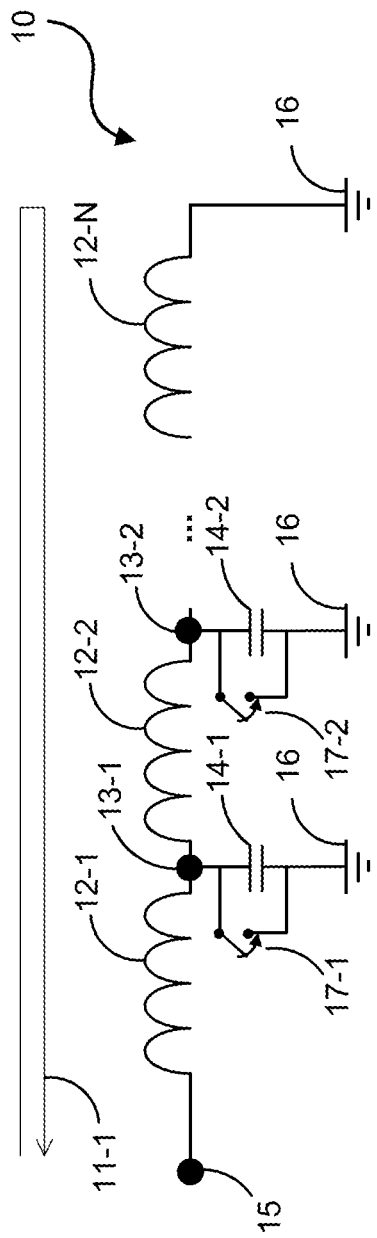
FIGS. 1A and 1B are circuit diagrams of one exemplary tunable resonator.

The figures and the following description illustrate specific exemplary embodiments. It will thus be appreciated that those skilled in the art will be able to devise various arrangements that, although not explicitly described or shown herein, embody certain principles and are included within the scope of the embodiments. Furthermore, any examples described herein are intended to aid in understanding the embodiments and are to be construed as being without limitation to such specifically recited examples and conditions. As a result, the embodiments are not limited to any of the examples described below.

Generally, the embodiments herein are operable to tune the effective electrical length of an artificial transmission line, as opposed to only tuning the capacitance of the artificial transmission line found in previous tunable resonators. In these embodiments, portions of the inductor are directly shorted to ground via switches (e.g., FETs), which has the effect of shortening the electrical length of the line, thus directly tuning $\tau_d$ in isolation by varying the number of inductor segments of the transmission line, where $\tau_d$ is the time delay of a signal propagating down the transmission line. To illustrate, the input impedance of a shorted stub transmission line resonator is described. And, the following assumes lossless components to simplify analysis:

$Z_{in}(\omega)=jZ_0 \tan(\omega\tau)$, where $Z_0$ is the characteristic impedance of the transmission line. In order to implement a fully generalized tunable resonator, precise and independent control of both $Z_0$ and $\tau_d$ are maintained. If this condition is met, arbitrary resonant elements can be constructed with shunt and series transmission line segments. In the case of an artificial transmission line composed of discrete LC elements, $Z_0=\sqrt{L/C}$ and $\tau_d=N\sqrt{LC}$, where "N" is the number of LC stages used. This is preferrable over previous capacitive only tuning systems that only vary C because $Z_0$ remains constant when N is varied. Thus, the impedance at resonance does not change from its desired value.

The embodiments herein provide a tuning range that is directly proportional to the number N of LC segments. And, this number of segments can be increased arbitrarily by shrinking L and C proportionally so that, as N grows, $\tau_d$ and $Z_0$ do not deviate from their desired values. In this way, wider tuning can be achieved with significantly lower losses than those found in other techniques, such as the capacitive only tuning techniques. In some embodiments, a tuning range of about 3.1 GHz to 51 GHz can be achieved, providing propagation capabilities for high millimeter-wave frequencies as well as low RF frequencies. And, as such, the embodiments herein can in a variety of applications, including passive filters of arbitrary shape and frequency, impedance matching networks, oscillators, tunable transformers, etc.

In the previous capacitive only tuning systems, only the value of C was varied, meaning that it was not possible to realize an arbitrary $Z_0$ and $\tau_d$, as the correct L can be specified at one frequency (i.e., not tunable). While it was possible to implement a variable inductance with only capacitive tuning, $Z_0$ and $\tau_d$ could not be independently varied in these previous systems. And, because capacitive only tuning systems vary $\tau_d$ by the square root of C, these tuning systems were capable of providing a more limited tuning range of about 1 GHz to 2 GHz, while requiring widely tunable variable capacitors that inherently result in higher signal losses.

Figure 1B:
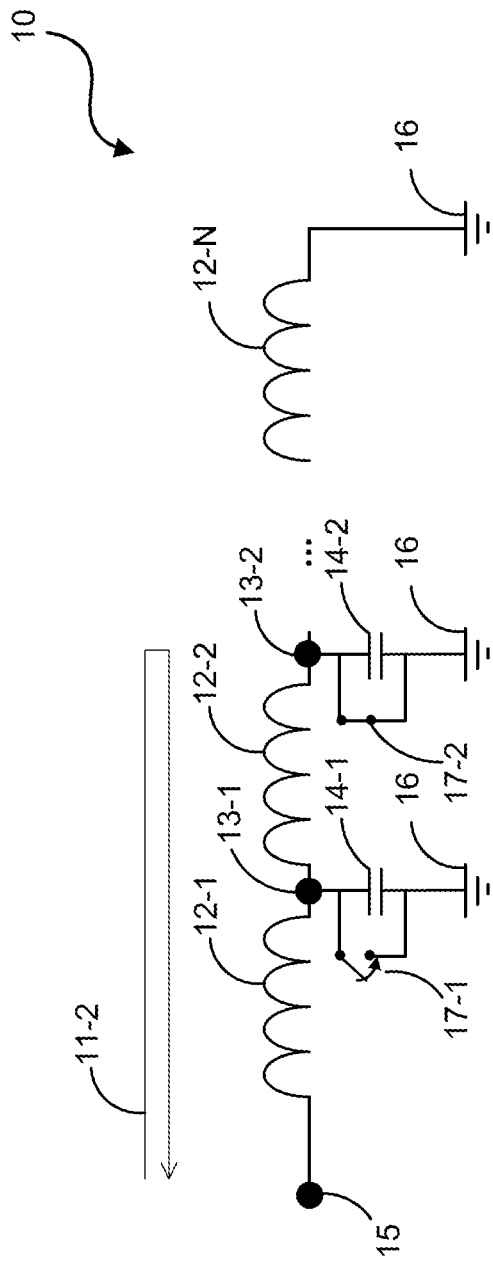

FIGS. 1A and 1B are circuit diagrams of one exemplary tunable resonator 10. In this embodiment, the resonator 10 is configured as a transmission line with a port 15 and a plurality of inductor segments 12-1-12-N (where the reference "N" is an integer greater than 1 and not necessarily equal to any other "N" reference designated herein). Between each inductor 12 is a tap 13 to which a capacitance 14 may be switchably coupled. For example, a switch 17-1 may be coupled to the tap 13-1 which, when opened, provides capacitance 14-1 to the transmission line. Similarly, the switch 17-2, when opened, provides capacitance 14-2 to the transmission line. Thus, in this configuration, the inductor segments 12 outnumber the capacitances 14 by one.

And, the transmission line of the resonator 10 terminates to ground 16 with the last inductor 12-N in the transmission line, thereby providing a transmission line length (e.g., quarter wavelength, half wavelength, etc.) operable to transmit an electromagnetic signal at a first frequency, as illustrated with the signal reflection 11-1.

In FIG. 1B, the switch 17-2 is closed at the tap 13-2, which decouples the capacitance 14-2 and shunts the transmission line to ground 16, effectively decoupling the remaining inductor segments 12 in the transmission line (e.g., all of the inductor segments 12 to the right of tap 13-2 in the drawing). This, in essence, shortens the overall length of the transmission line of the resonator 10 such that higher frequency electromagnetic signals may be transmitted therefrom (e.g., with respect to FIG. 1A), as illustrated in the signal reflection 11-2. Accordingly, the length of the transmission line and, thus the tuning range of the resonator 10, is selectively controlled based on the controlled opening and closing of the switches 17 along the transmission line.

As used herein, the term "inductor segments" is intended to encompass the traditional meaning of individual inductors, a single inductor configured with taps 13, and various combinations thereof. In some embodiments, the switches 17 are transistors, such as FETs, that inherently have a parasitic capacitance, usually an undesirable feature. However, the parasitic capacitances of the transistors may be used instead of the capacitors 14 so as to selectively provide capacitance to the transmission line, and thus alter the resonant frequency of the tunable resonator 10. For example, when FETs are implemented along the transmission line at the taps 13, they provide parasitic capacitance to the transmission line when the FETs are "off". When the FETs are "on" along the transmission line, the FETs shunt their respective portions of the transmission line to ground 16 and change the effective length of the transmission line. Some examples of the switches include complementary metal oxide semiconductor FETs (CMOS FETs), Gallium Nitride high-electron-mobility transistors (GaN HEMTs), radio-frequency microelectromechanical system (RF MEMS) switches, Gallium Arsinide HEMTs (GaAs HEMTs), and the like.

The embodiments herein provide for the tuning of the resonator 10. Thus, for devices that require the use of many wireless channels with different standards (e.g. cellular phones, tablet computers, computers, drones, autonomous vehicles, software defined radios—"SDRs", etc.), a single signal path (e.g., radio) can address each of these standards. This reduction in complexity allows for greater miniaturization and reduced costs for implementing antennas for such differing standards. For some applications, such as frequency modulated continuous wave (FMCW) radar, fundamental limitations can be exceeded due to the unprecedented tuning range of the embodiments herein.

The embodiments herein provide a range of frequency operations and performance on par with resonant narrowband designs. Until now, such frequency operations and performance could not been achieved in ultra-wideband (UWB) systems or other tunable designs. And, by using conventional electronic components, the embodiments herein realize a wide tuning range with little to no sacrifice to other relevant specifications of resonators, such as quality factor ("Q-factor", i.e., a measure of the purity of the resonance), physical size, and power consumption. For example, the degradation in Q-factor is significantly lower than existing approaches that are capable of greater than one octave of tuning. In some embodiments, the resonator is a passive component using little to no power consumption. In some embodiments, the Q-factor is comparable to existing LC tank resonators when using conventional CMOS components that can be improved as newer transistor technologies emerge, such as Gallium Nitride Field Effect Transistors ("GaN FETs").

Figure 2:
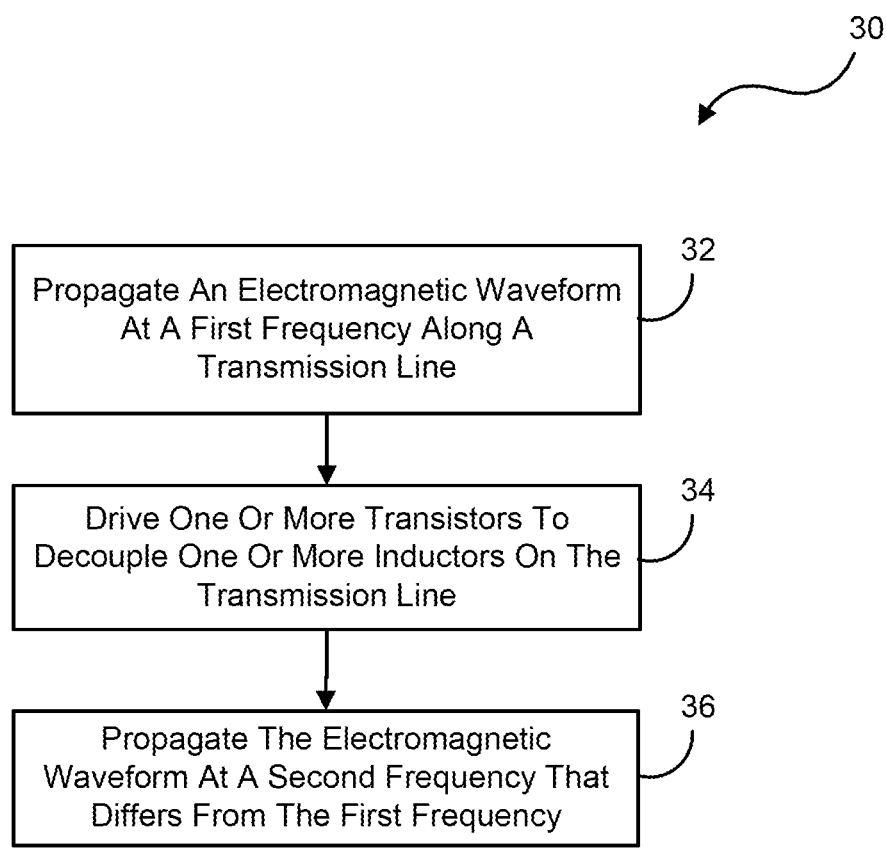
FIG. 2 is a flowchart of an exemplary process of the tunable resonator.

FIG. 2 is a flowchart of an exemplary process 30 of the tunable resonator 10. In this embodiment, the tunable resonator 10 may propagate an electromagnetic waveform at a first frequency along a transmission line, in the process element 32. As mentioned, the transmission line includes a plurality of inductor segments 12 with taps 13 between each of the inductor segments along the transmission line. And, a switch 17, such as a FET, may be coupled at each tap 13 along the transmission line. Thus, when one or more the switches 17 close, the length of the transmission line is effectively changed (e.g., shortened) which changes the resonant frequency of the transmission line. In this regard, a controller or some other processing system, may drive one or more of the transistors on the transmission line to decouple one or more of the inductor segments on the transmission line, in the process element 34, such that the electromagnetic waveform may be propagated at a second frequency (i.e., a higher frequency) that differs from the first frequency, in the process element 36.

Figure 3:
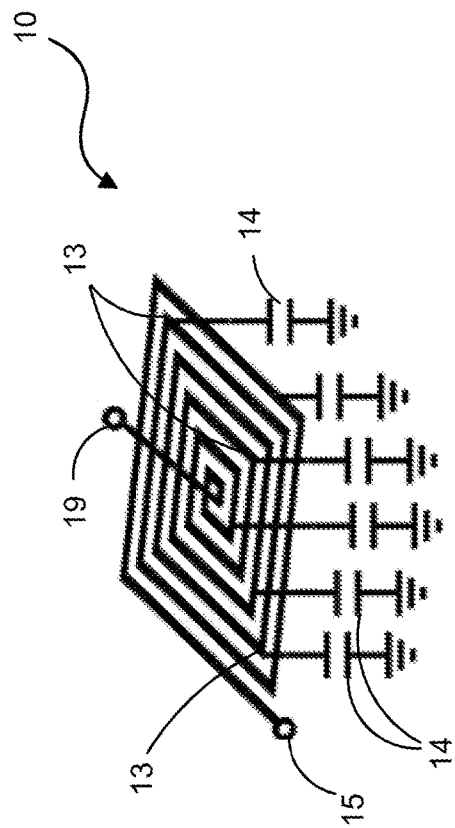
FIG. 3 illustrates a planar configuration of the tunable resonator in one exemplary embodiment.

FIG. 3 illustrates a planar configuration of the tunable resonator 10. In this embodiment, the tunable resonator 10 uses an artificial transmission line with an electrical length of greater than or equal to a ¼ wavelength of the lowest desired resonant frequency. Previously, designs targeting lower RF were prohibitively large for integrated circuits. To counter such, the tunable resonator 10 in this embodiment comprises a relatively large spiral inductor with a plurality of discrete taps 13 for transistor switches or capacitors 14. In some embodiments, a square spiral is considered the most efficient two-dimensional (2D) shape for realizing inductance, which generally determines the physical size of the artificial transmission line. And, lumped capacitive elements 14 (e.g., capacitors and/or transistors) are generally much smaller in integrated circuit form such that they can be configured below the spiral, further saving area compared to conventional artificial transmission lines.

Figure 4:
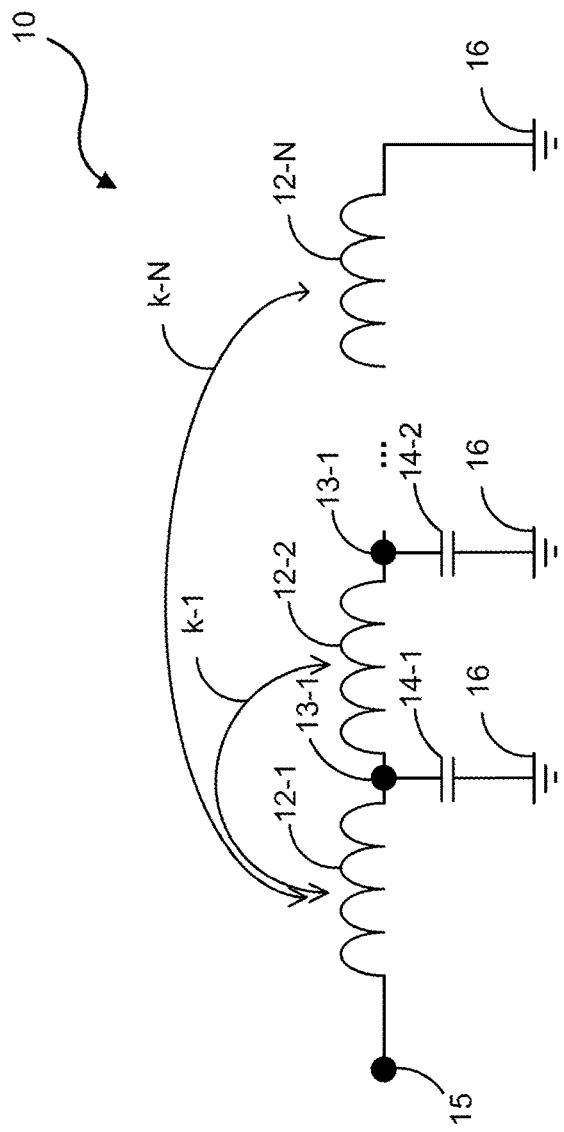
FIG. 4 is a circuit diagram of the tunable resonator illustrating mutual inductances in one exemplary embodiment.

In some embodiments, this configuration of the tunable resonator 10 causes the mutual inductance between different parts of the spiral to couple a signal on the transmission line from each inductance segment to others all along the transmission line, typically an undesirable feature. However, in this embodiment, this behavior is acceptable since the mutual inductance decreases for further sections of the line, and since the mutual inductance from one turn to another is not that large for a flat spiral inductor. A model of the mutual inductances is illustrated in FIG. 4. Generally, the mutual inductance k−1 is relatively small in the planar configuration of the tunable resonator 10. And, mutual coupling decreases for each further inductor segment (e.g., k-N at the inductor segment 12-N). Simulations and measurements have shown that the only degradation caused by this mutual inductance regarded a slight decrease in the maximum allowable frequency of the transmission line. For example, measurements have shown that mutual inductance effects can be minimized over greater than one decade of bandwidth in the case of a planar, square spiral design, such as that shown and described in FIG. 3.

Figure 5:
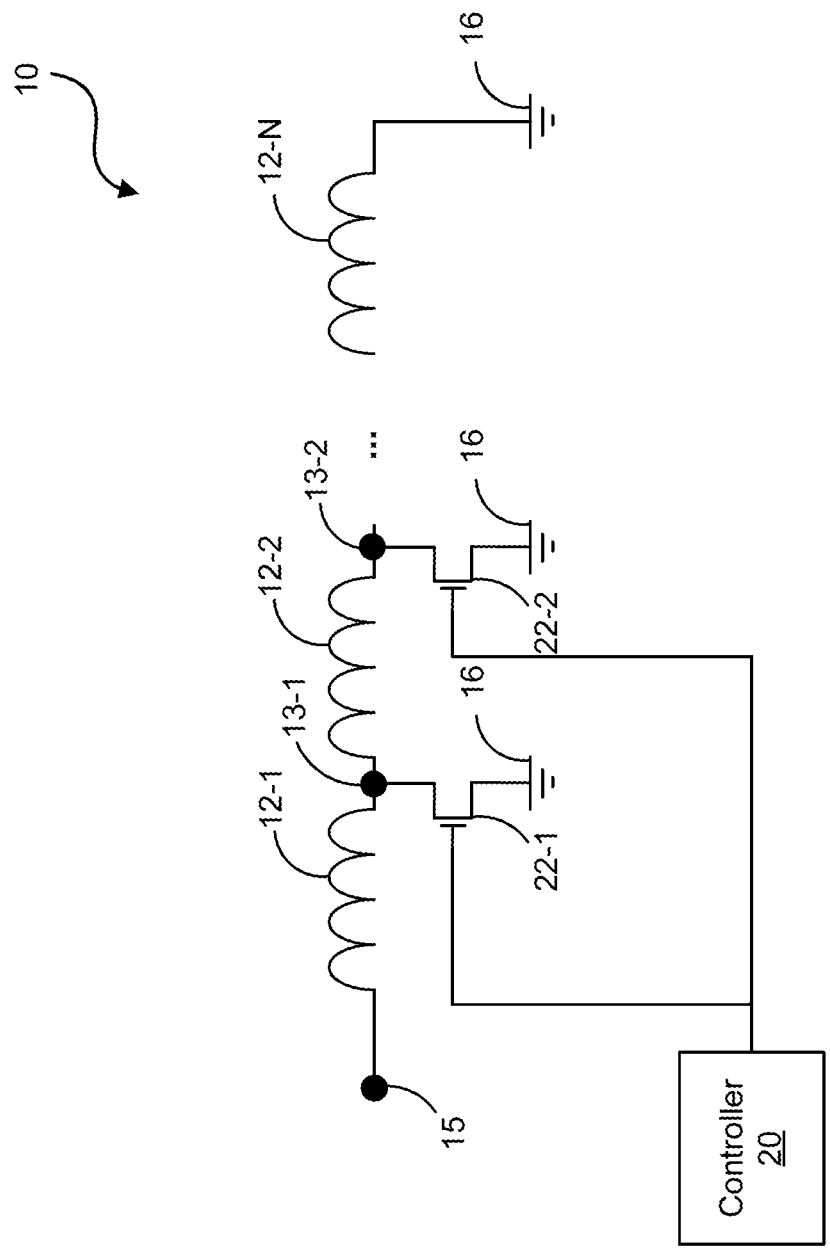
FIG. 5 is a circuit diagram of the tunable resonator configured with field effect transistors (FETs) in one exemplary embodiment.

FIG. 5 is a circuit diagram of the tunable resonator 10 configured with FETs 22 in one exemplary embodiment. In this embodiment, the FETs 22 replace the switches 17 and capacitors 14 as the FETs 22 provide the parasitic capacitance for the transmission line of the tunable resonator 10.

In this regard, a controller 20 may drive the FETs 22 (e.g., turn the FETs 22 "on") to selectively shunt portions of the transmission line to ground 16 and shorten the length of the transmission line, thereby effectively changing the resonant frequency of the tunable resonator 10. And, when the lower frequency is desired, the FETs 22 may be turned "off" to re-couple the inductor segments 12 of the transmission line. It should be noted that the controller 20 may be implemented in a variety ways as a matter of design choice. Generally, any device capable of driving the FETs 22 as desired may be used. Additionally, the FETs 22 may be driven in a variety ways as a matter of design choice. For example, the FETs 22 may be turned on and off sequentially along the transmission line or they may be turned "on" and "off" as desired. Generally though, the FETs 22 are turned "on" in sequential order from the last inductor segment 12-N on the transmission line to shorten the transmission line to the desired frequency of transmission.

The resonator 10 can be optimally designed for a specific frequency range by designing a compact artificial transmission line from conventional artificial transmission line equations for an electrical length of ¼ wavelength for the lowest desired frequency. For example, tap spacings may be established to be equal to ¼ wavelength of the highest desired frequency. Assuming a lossless components and no mutual inductance, the tap spacing (e.g., in meters) is given by $$d = \frac{Z_0}{4\ell f_{max}},$$

where fmax is the maximum desired frequency, Z0 is the desired characteristic impedance, and $\ell$ is the inductance per unit length of the inductive element in H/m (Henries per meter). The capacitance needed at each tap may then be given by $$C = \frac{1}{4Z_0 f_{max}}.$$

Then, FETs that are sized to present the correct capacitance for the designed artificial transmission line may be selected for each tap. In some embodiments, this may include designing a spiral inductor with a total inductance to realize the artificial transmission line, such as those shown in FIGS. 3 and 6. And, if finer tuning control is desired in such embodiments, the number of taps may be increased without increasing the total spiral inductance. It should be noted that the embodiments herein are not intended to be limited to ¼ wavelength propagations. Generally, any of the embodiments herein may be configured to propagate signals at a variety of wavelengths, such as ⅛, ¼, and ½ wavelengths.

Figure 6:
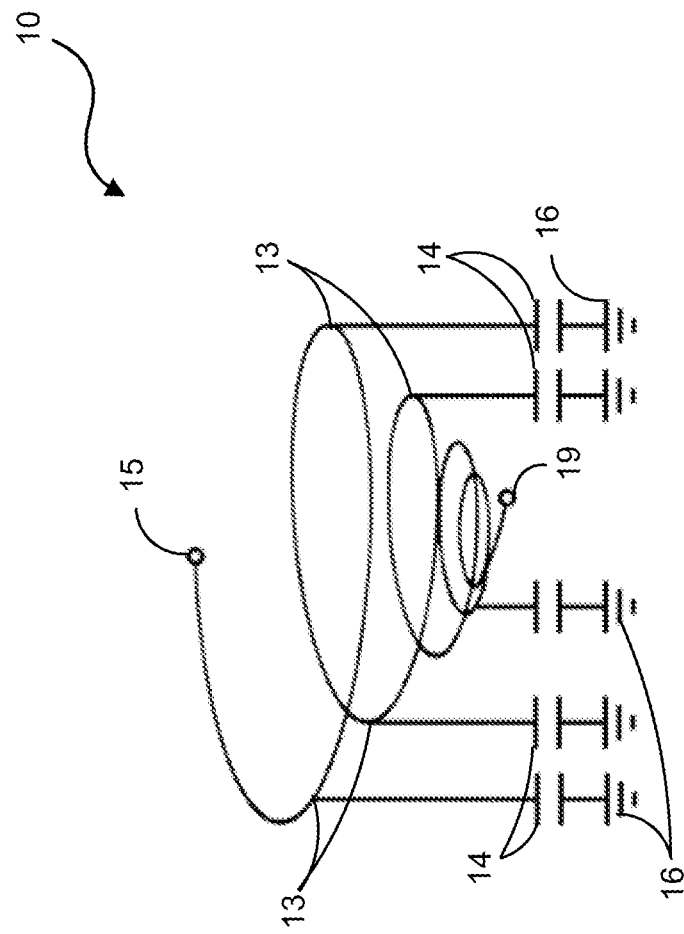
FIG. 6 illustrates a conical configuration of the tunable resonator in one exemplary embodiment.

FIG. 6 illustrates a conical configuration of the tunable resonator 10 in one exemplary embodiment. In this embodiment, a three-dimensional (3D) inductor shape provides more inductance per unit area and/or a higher quality factor than the 2D planar/spiral inductor configuration of FIG. 3. By using two spirals, the layout of such a resonator can be even further compacted. And, switches can be placed at each tap 13 (e.g., where the capacitors 14 couple to the transmission line) to form re-configurable distributed amplifiers.

Figure 7:
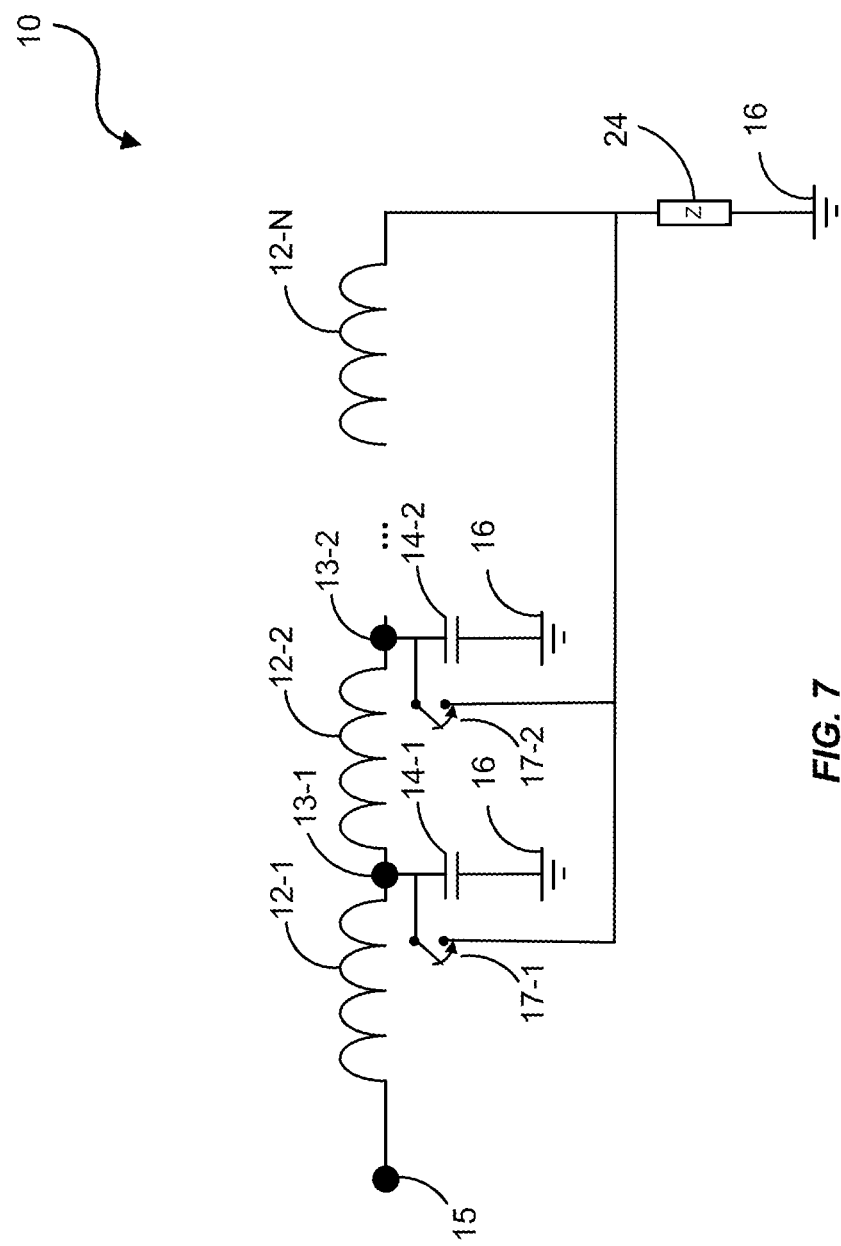
FIG. 7 is a circuit diagram of the tunable resonator configured with an impedance in one exemplary embodiment.
Figure 8:
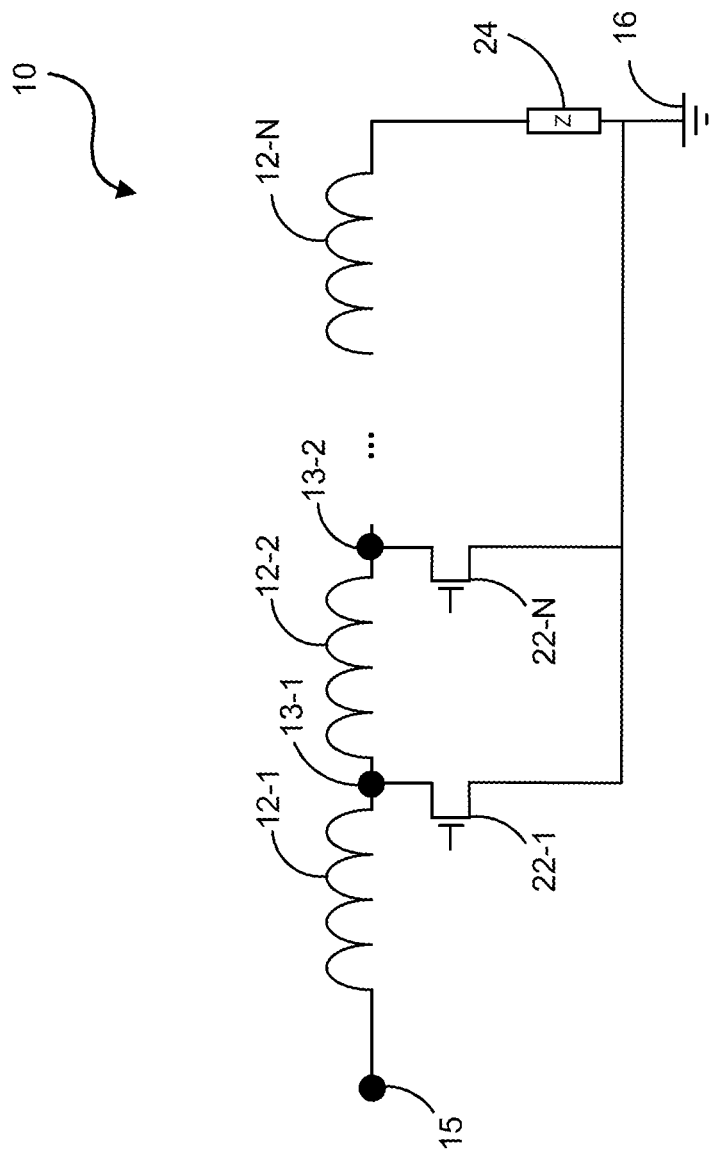
FIG. 8 is a circuit diagram of the tunable resonator configured with an impedance in another exemplary embodiment.

FIG. 7 illustrates a circuit diagram of the tunable resonator 10 configured with an impedance 24 in one exemplary embodiment. In this embodiment, instead of terminating each switch 17 to ground 16, the tunable resonator 10 employs an arbitrary impedance 24 to terminate the artificial transmission line. Generally, any impedance 24 can be used depending on the desired impedance for the transmission line. FIG. 8 illustrates a circuit diagram of the tunable resonator 10 configured with an impedance 24 in another exemplary embodiment with the switches 17 and capacitors 14 being replaced with FETs 22.

Figure 9:
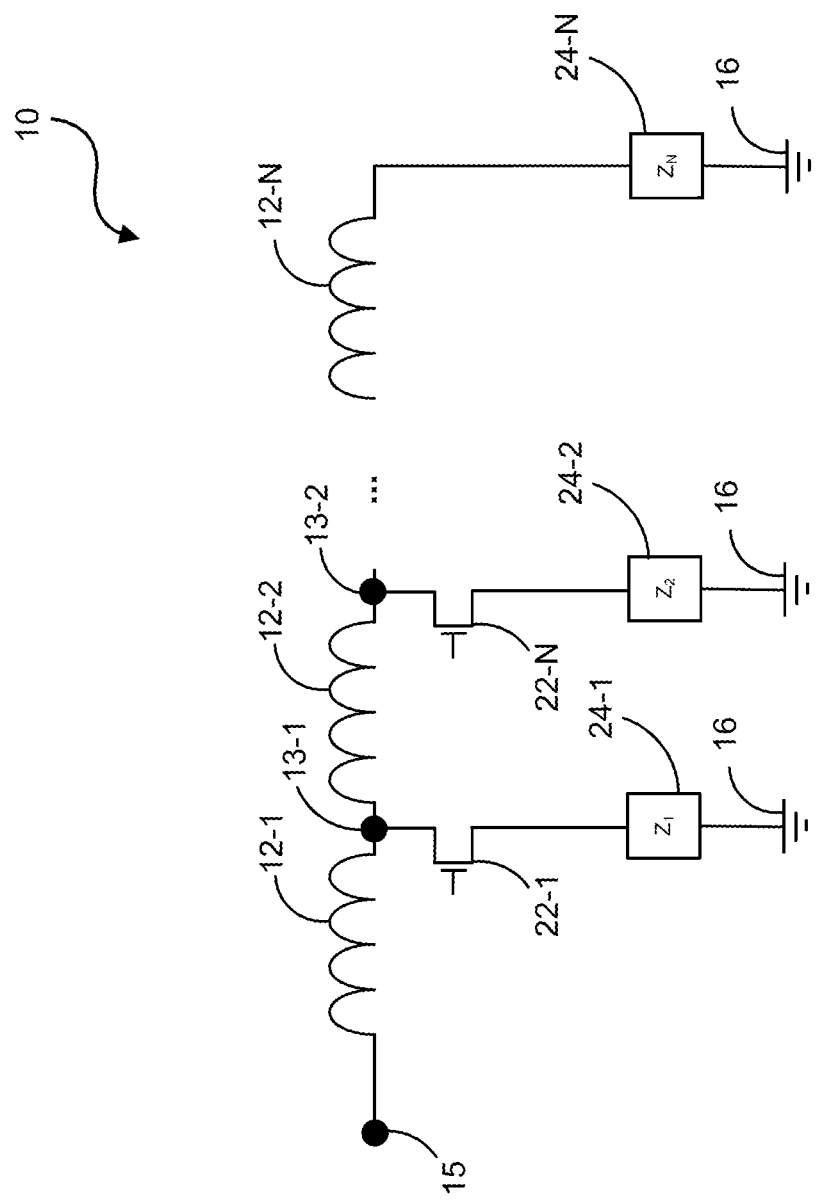
FIG. 9 is a circuit diagram of the tunable resonator configured with a plurality of different impedances in one exemplary embodiment.

FIG. 9 illustrates a circuit diagram of the tunable resonator 10 configured with a plurality of impedances 24 in one exemplary embodiment. In this embodiment, the impedances 24 are coupled to the taps 13 at terminals of their respective FETs 22, with the impedance 24-N being coupled at the end of the transmission line of the tunable resonator 10 (e.g., at the end of the inductor segment 12-N). The values of the impedances 24 can be the same or different depending on the design choice. Different impedance values at the taps 13 may result in a more complex behavior as each FET 22 is driven (e.g., turned "on" and "off"). In any case, this embodiment of the tunable resonator 10 still illustrates that when the FETs 22 are driven, the FETs 22 shunt their respective portions of the transmission line to ground 16 to effectively decouple the inductor segments 12 and change the resonance of the tunable resonator 10.

Figure 10:
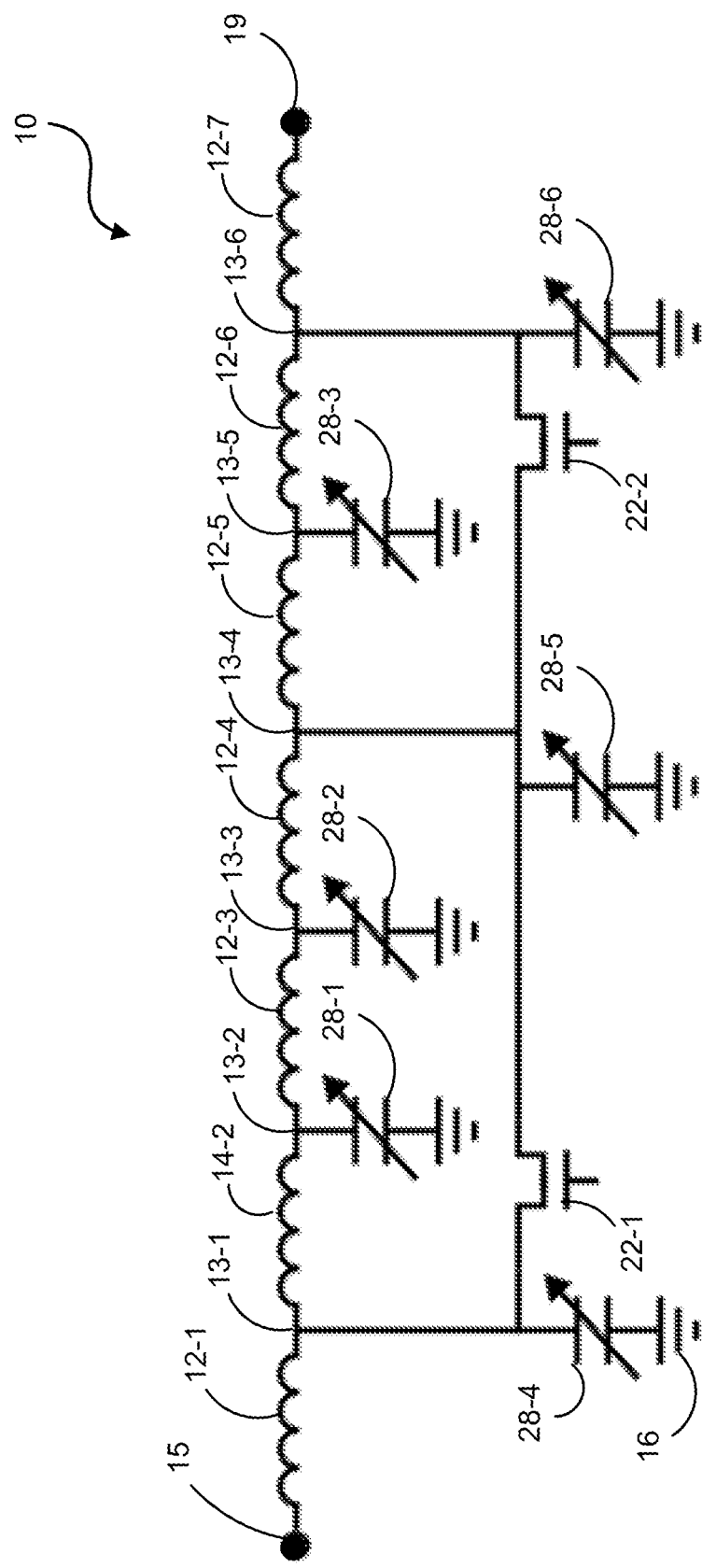
FIG. 10 is a circuit diagram of the tunable resonator configured with a plurality of variable capacitors in one exemplary embodiment.

FIG. 10 illustrates a circuit diagram of the tunable resonator 10 configured with a plurality of variable capacitors 28-1-28-6. In this embodiment, sections of the transmission line of the tunable resonator 10 are selectively "shorted out" via drive signals controlling the FETs 22-1 and 22-2. For example, assuming sufficiently variable capacitors, when both FETs 22-1 and 22-2 are "off", the transmission line employs each of the inductor segments 12-1-12-7 between the ports 15 and 19. However, when the FET 22-1 is turned "on", the inductor segments 12-2-12-4 are shorted out of the transmission line, leaving only the inductor segments 12-1, 12-5, 12-6, and 12-7 in the transmission line, effectively shortening the transmission line. Alternatively, when the FET 22-2 is turned "on", the inductor segments 12-5 and 12-6 are shorted out of the transmission line, leaving only the inductor segments 12-1, 12-2, 12-3, 12-4, and 12-7 in the transmission line, again effectively shortening the transmission line. And, when both FETs 22-1 and 22-2 are turned "on", only the inductor segments 12-1 and 12-7 remain in the transmission line, again effectively shortening the transmission line.

As can be seen in this embodiment, the transmission line of the tunable resonator 10 can be shortened without requiring a shunt to ground 16 at the port 19 to provide a variable length transmission line without reflections. It should be readily understood that the FETs 22 can be configured in various ways to alter the length of the transmission line and that the tunable resonator 10 should not be limited to the specific embodiment illustrated herein.

Figure 11:
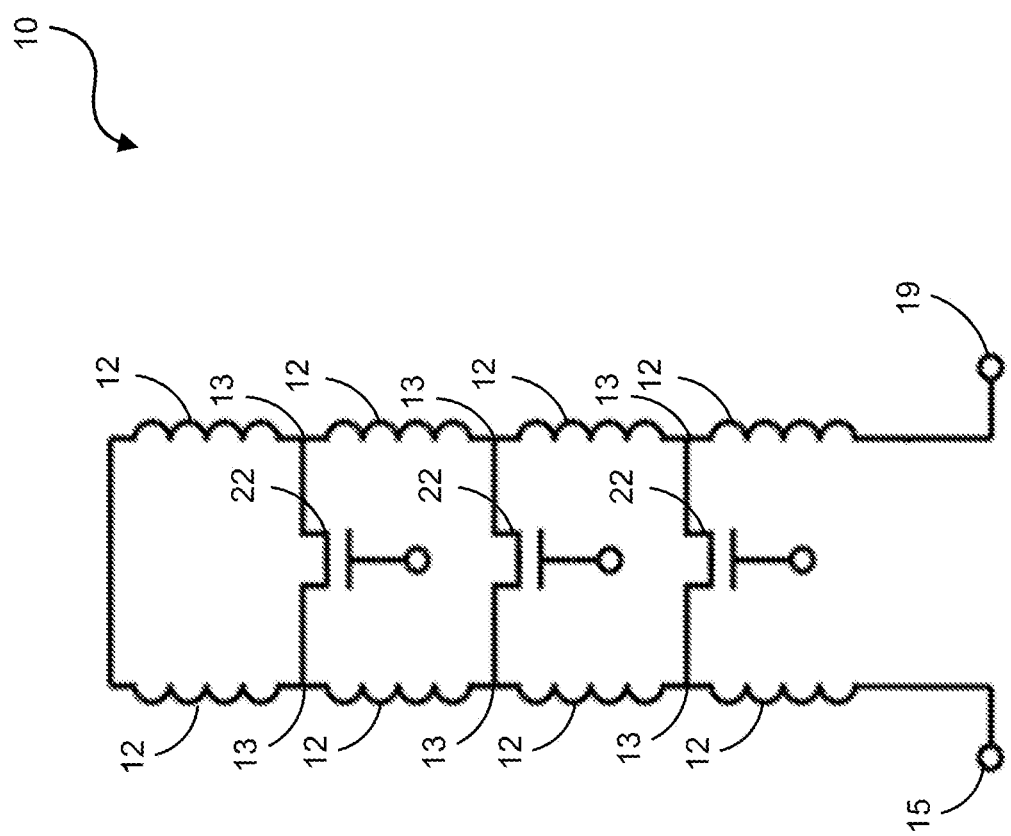
FIG. 11 is a circuit diagram of the tunable resonator 10 in another exemplary embodiment.

FIG. 11 is a circuit diagram of the tunable resonator 10 in another exemplary embodiment. In this embodiment, the tunable resonator 10 is configured as a series resonator using the same or similar tuning principles described herein. This series, shorted transmission line stub resonator is presented between the ports 15 and 19 and can be shortened by turning on the FETs 22 (e.g., starting with FETs 22 furthest from the ports 15 and 19) to reduce the electrical length of the line, and thereby increase the resonant frequency of the tunable resonator 10.

Generally, both shunt and series tunable resonators are required for arbitrary passive filter synthesis. However, in a configuration without significant parasitic FET capacitance to a ground plane (e.g., a non-planar technique such as that shown in FIG. 6, or a planar technique built on a highly-resistive substrate such as that shown in FIG. 3), a series tunable transmission line resonator can be used with an existing shunt resonator where series components are used and/or are more practical.

The artificial transmission line can be constructed with either a single, multi-tap inductor, or individual inductors for each segment of the artificial transmission line. These inductors can be multi-turn spirals, solenoids, 3D conical inductors, or planar distributed inductive elements as long as they implement an inductance between each tap 13 where a FET 22 connects.

Figure 12:
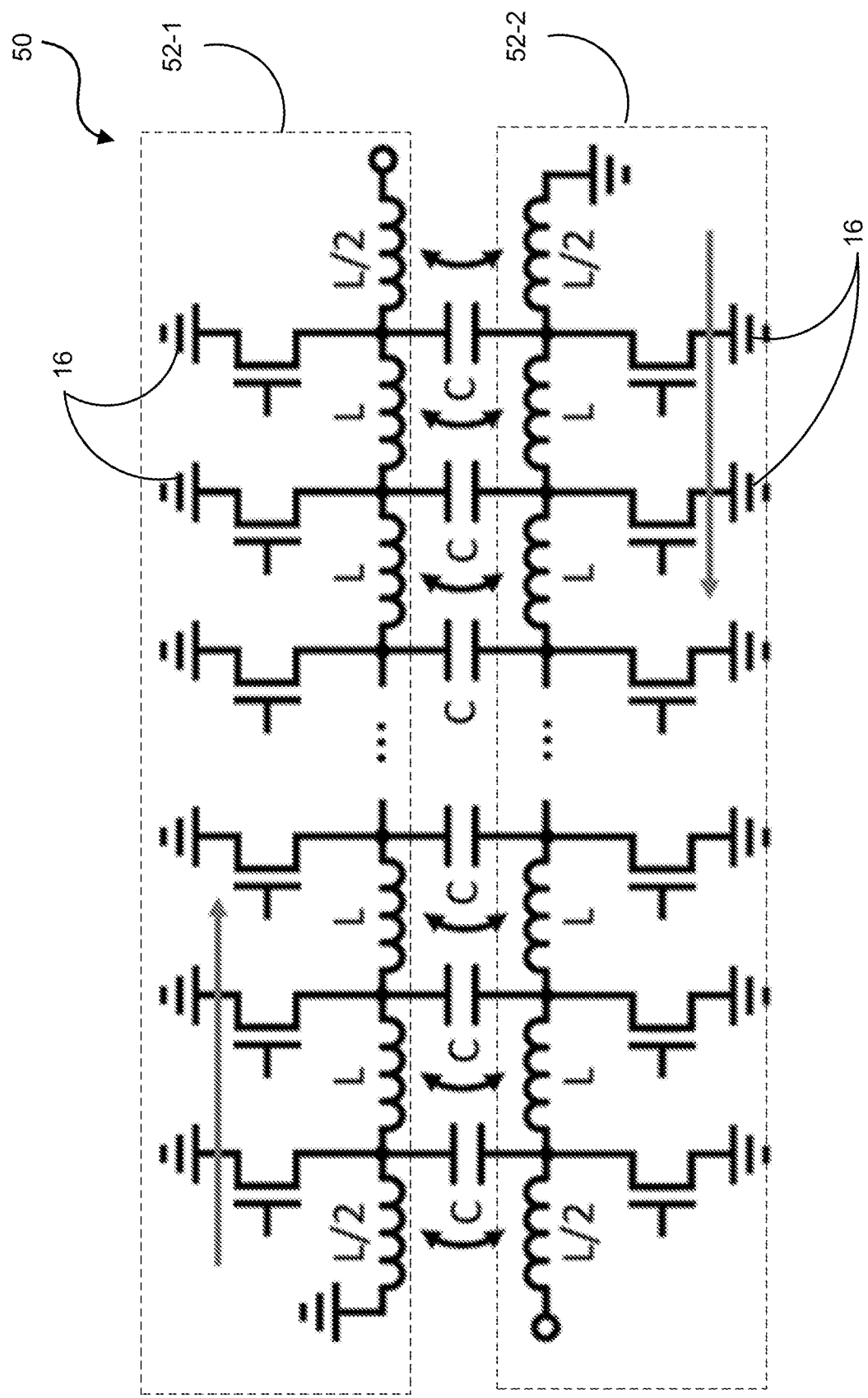
FIG. 12 is a circuit diagram of a tunable RF coupled inductor filter in one exemplary embodiment.

Coupled tunable transmission lines are also possible by placing two resonators near each other so that their magnetic fields interact. One example of an RF coupled inductor filter 50 is shown in FIG. 12, which can be tuned so long as the two resonators 52-1 and 52-2 are appropriately located to achieve a correct coupling factor k. This bandpass filter is operable to reject signals outside a desired frequency range. However, by shorting portions of the two resonators 52-1 and 52-2 to ground 16 using the proposed tuning technique, the filter shape can be preserved while the center frequency is tuned over a relatively wide range.

Figure 13B:
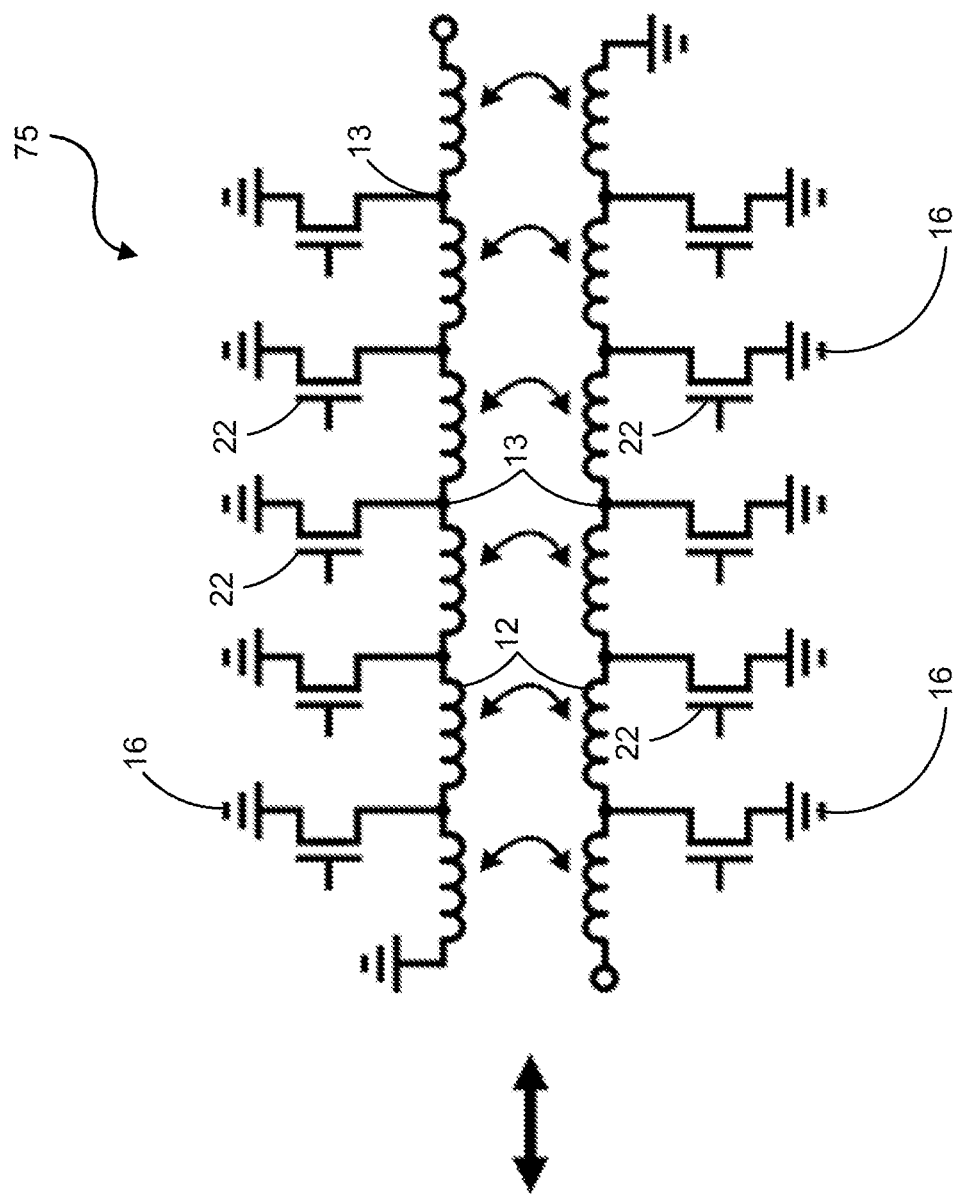
FIGS. 13A and 13B are circuit diagrams of a tunable transformer in one exemplary embodiment.
Figure 13A:
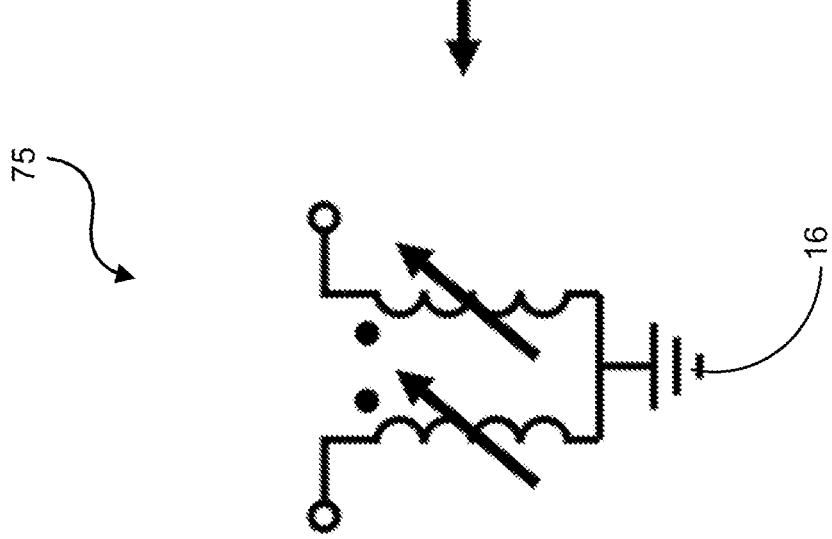
Figure 14:
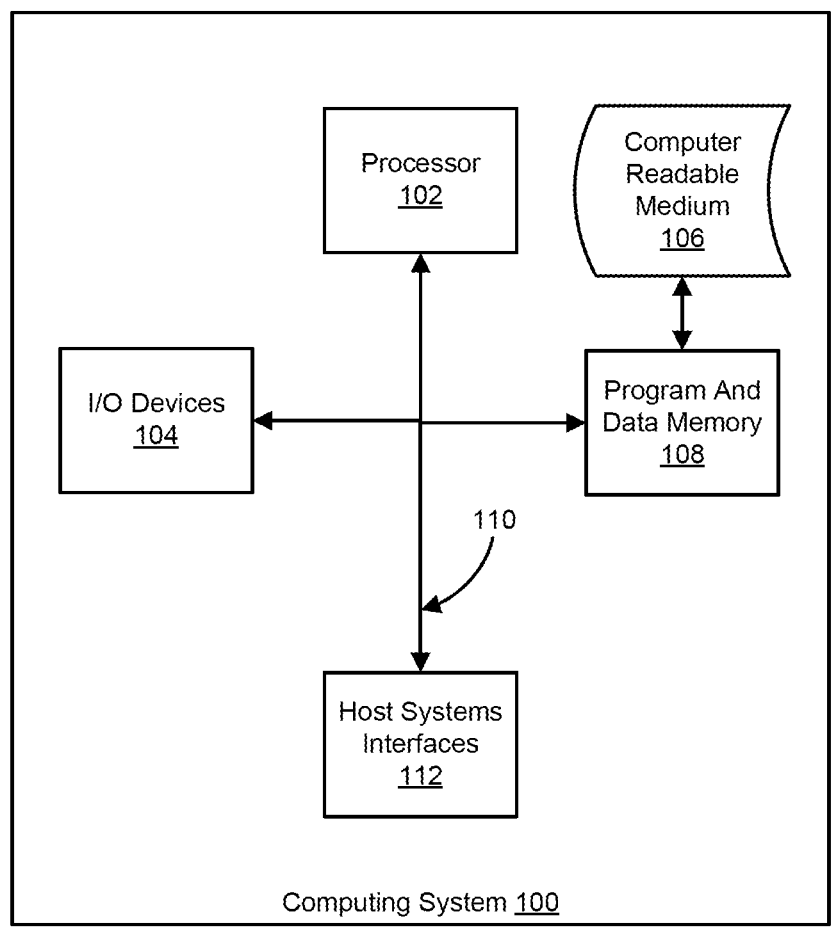
FIG. 14 is a block diagram of an exemplary computing system in which a computer readable medium provides instructions for performing methods herein.

The embodiments herein may be suitable for tunable transformers as well. FIGS. 13A and 13B illustrate a tunable transformer 75 in one exemplary embodiment. FIG. 13A illustrates a general diagram of the tunable transformer 75 illustrating the variable inductances between the transformer windings. And, FIG. 13B illustrates the circuit diagram realization of such a transformer 75. Uniform inductance and FET sizing (e.g., to present non-uniform parasitic capacitance to ground between each inductor segment) are not required in this embodiment. Varying the inductance and capacitance between each tap 13 can be used to implement tapered or stepped transmission lines which remain tunable. This may be useful in applications which either present external parasitic capacitance or inductance that is compensated differently at different frequencies. This embodiment may also be used to intentionally "build in" a varying characteristic impedance across tuning.

In summary, FETs generally have parasitic capacitance that is often a detriment to resonator performance. However, in the embodiments disclosed herein, the tunable resonator 10 uses that capacitance at each tap 13 to implement a compact artificial transmission line. Thus, even large FET devices can be placed along the line without detrimental effect. If all of the FETs in the transmission line are turned off, then resonance occurs at the lowest frequency set by the length of the artificial transmission line. To tune the frequency, the FET switches may be sequentially turned on starting at the far end of the line. This generally results in a section of transmission line that is electrically shorted to ground and presents a low impedance, with the remaining section of the transmission line still being operable. And, a signal can propagate along the operable portion of line, reflecting back off the first FET that is turned on. This generally means that the electrical length of the line appears shortened, and the frequency at which the line has an electrical length of ¼ wavelength will be changed. Thus, the highest possible resonant frequency may be determined by the electrical delay between the taps 13. And, for "N" taps 13, there are "N+1" frequency settings between the lowest and highest resonant frequencies of the tunable resonator 10.

The embodiments herein may be employed in virtually any electronic and/or mechanical resonators that are used in electronic circuits where a relatively wide tuning range is desired. For example, the embodiments herein may be employed in RF-MMW filters and/or diplexers, RF-MMW matching networks, RF-MMW tuned amplifiers (e.g., low-noise amplifiers and power amplifiers), RF-MMW oscillators and frequency synthesizers, and RF-MMW resonant mixers. The embodiments herein can be used as standalone transmission lines but also can be used as subcomponents of larger systems. For example, the embodiments herein may be used in multi-standard and/or software-defined RF/MMW transceivers, including Wi-Fi, Bluetooth, industrial, scientific and medical (ISM), Global System for Mobile communications (GSM), Long term Evolution communications (LTE), and ZigBee communications. The embodiments herein may also be used as radar transceivers (e.g., frequency modulated continuous wave radar), 5G wireless systems, and wideband RF-MMW power detectors and spectrum sensors.

In some embodiments, the controller 20 is operable to drive gates of the FETs according to an RF signal being propagated along the transmission line. For example, the tunable resonator may be operable to transceive frequency hopped signals that "hop" from one frequency to another. In this regard, the controller may control the FETs 22 of the tunable resonator 10 in such a way that they "follow" the manner in which the signal hops between frequencies such that the signal may be transmitted and/or received.

In some embodiments, the tunable resonator 10 may be also employed to conceal RF communications. For example, instead of or in addition to encrypting an RF communication signal, the signal may be transmitted and/or received at different frequencies according to how the FETs 22 control the tunable resonator. Thus, switching of the FETs 22 may in essence be used to encrypt the actual RF of the communication signal. To illustrate, a communication signal may be hopped over various frequencies based on some "encryption signal" (e.g., a pseudo random sequence) applied to the gates of the FETs at various times.

Any of the above embodiments herein may be rearranged and/or combined with other embodiments as a matter of design choice. Accordingly, the concepts herein are not to be limited to any particular embodiment disclosed herein. Additionally, the embodiments can take the form of entirely hardware or comprising both hardware and software elements. Portions of the embodiments may be implemented in software, which includes but is not limited to firmware, resident software, microcode, etc. FIG. 11 illustrates a computing system 100 in which a computer readable medium 106 may provide instructions for performing any of the methods disclosed herein.

Furthermore, portions of the embodiments can take the form of a computer program product accessible from the computer readable medium 106 providing program code for use by or in connection with a computer or any instruction execution system. For the purposes of this description, the computer readable medium 106 can be any apparatus that can tangibly store the program for use by or in connection with the instruction execution system, apparatus, or device, including the computer system 100.

The medium 106 can be any tangible electronic, magnetic, optical, electromagnetic, infrared, or semiconductor system (or apparatus or device). Examples of a computer readable medium 106 include a semiconductor or solid state memory, magnetic tape, a removable computer diskette, a random access memory (RAM), NAND flash memory, a read-only memory (ROM), a rigid magnetic disk and an optical disk. Some examples of optical disks include compact disk-read only memory (CD-ROM), compact disk-read/write (CD-R/W) and digital versatile disc (DVD).

The computing system 100, suitable for storing and/or executing program code, can include one or more processors 102 coupled directly or indirectly to memory 108 through a system bus 110. The memory 108 can include local memory employed during actual execution of the program code, bulk storage, and cache memories which provide temporary storage of at least some program code in order to reduce the number of times code is retrieved from bulk storage during execution. Input/output or I/O devices 104 (including but not limited to keyboards, displays, pointing devices, etc.) can be coupled to the system either directly or through intervening I/O controllers. Network adapters may also be coupled to the system to enable the computing system 100 to become coupled to other data processing systems, such as through host systems interfaces 112, or remote printers or storage devices through intervening private or public networks. Modems, cable modem and Ethernet cards are just a few of the currently available types of network adapters.

What is claimed is:

1. A tunable resonator, comprising:
a transmission line comprising at least two inductor segments and a tap between each of the at least two inductor segments; and
one less switch than a number of the at least two inductor segments on the transmission line,
wherein each switch is coupled to one of the taps, and wherein each switch is operable to decouple at least one of the at least two inductor segments in the transmission line by shunting a transmission line stub of the transmission line to ground to change a resonant frequency of the transmission line.

2. The tunable resonator of claim 1, wherein:
each switch has a capacitance that changes the resonant frequency of the transmission line when the switch is turned off.

3. The tunable resonator of claim 1, wherein:
each switch is a field effect transistor (FET); and the tunable resonator further comprises a controller operable to drive a gate of each FET and shunt said at least a portion of the transmission line to ground or further comprises an impedance coupled between a terminal of at least one of the FETs and ground.

4. The tunable resonator of claim 3, wherein:
the controller is operable to drive the gate of one or more of the FETs according to a radio frequency signal being propagated along the transmission line.

5. The tunable resonator of claim 1, wherein:
each switch is a field effect transistor (FET); and
at least one of the FETs has a terminal coupled to ground.

6. The tunable resonator of claim 1, wherein the tunable resonator has a tuning frequency range of about 3.1 GHz to 51 GHz.

7. The tunable resonator of claim 1, wherein:
the transmission line comprises at least one of a three dimensional configuration or a planar configuration.

8. A bandpass filter comprising the tunable resonator of claim 1 as a first tunable resonator, the bandpass filter further comprising:
a second tunable resonator comprising a transmission line comprising at least two inductor segments and a tap between each of the at least two inductor segments; and one less switch than a number of the at least two inductor segments on the transmission line, wherein each switch is coupled to one of the taps, and wherein each switch is operable to decouple at least one of the at least two inductor segments in the transmission line by shunting a transmission line stub of the transmission line to ground to change a resonant frequency of the transmission line, wherein the first tunable resonator and the second tunable resonator are configured to cause magnetic fields generated during operation to interact to achieve a coupling factor k to reject signals outside a desired frequency range.

9. A tunable transformer comprising the tunable resonator of claim 1 as a first tunable resonator, the tunable transformer further comprising:

a second tunable resonator comprising a transmission line comprising at least two inductor segments and a tap between each of the at least two inductor segments; and one less switch than a number of the at least two inductor segments on the transmission line, wherein each switch is coupled to one of the taps, and wherein each switch is operable to decouple at least one of the at least two inductor segments in the transmission line by shunting a transmission line stub of the transmission line to ground to change a resonant frequency of the transmission line, wherein the first tunable resonator and the second tunable resonator are the same or different.

10. A method, comprising:

propagating an electromagnetic waveform at a first frequency along a transmission line that comprises at least two inductor segments, a tap between each of the at least two inductor segments, and one less switch than a number of the at least two inductor segments on the transmission line, wherein each switch is coupled to one of the taps;

driving at least one of the switches to decouple at least one of the at least two inductor segments on the transmission line by shunting a transmission line stub of the transmission line to ground to change a resonant frequency of the transmission line; and propagating the electromagnetic waveform at a second frequency along the transmission line, wherein the second frequency differs from the first frequency.

11. The method of claim 10, further comprising:

turning off said at least one of the switches to provide a capacitance to the transmission line.

12. The method of claim 10, wherein:

each switch is a field effect transistor (FET); and
at least one of the FETs has a terminal coupled to ground.

13. The method of claim 10, wherein:

each switch is a field effect transistor (FET); and
the method further comprises driving, via a controller, a gate of at least one of the FETs to shunt said at least a portion of the transmission line to ground; or the method further comprises providing an impedance between a terminal of at least one of the FETs and ground.

14. The method of claim 13, further comprising:

driving, via the controller, the gate of one or more of the FETs according to a radio frequency signal being propagated along the transmission line.

15. The method of claim 10, wherein:

the transmission line comprises at least one of a three dimensional configuration or a planar configuration.

16. A non-transitory computer readable medium comprising instructions that, when executed by a controller, direct the controller to:

in a transmission line that comprises at least two inductor segments, a tap between each of the at least two inductor segments, and one less switch than a number of the at least two inductor segments on the transmission line, wherein each switch is coupled to one of the taps, drive at least one of the switches to decouple at least one of the at least two inductor segments on the transmission line by shunting a transmission line stub the transmission line to ground to change a resonant frequency of the transmission line.

17. The computer readable medium of claim 16, wherein:

each switch is a field effect transistor (FET); and
the computer readable medium further comprises instructions that direct the controller to drive a gate of at least one of the FETs to shunt said at least a portion of the transmission line to ground.

18. The computer readable medium of claim 17, further comprising instructions that direct the controller to:

drive the gate of one or more of the FETs according to a radio frequency signal being propagated along the transmission line.

19. The computer readable medium of claim 16, wherein:

each switch is a field effect transistor (FET); and
at least one of the FETs has a terminal coupled to ground or is coupled to an impedance between a terminal of said at least one FET and ground.

20. The computer readable medium of claim 16, further comprising instructions that direct the controller to:

turn off said at least one of the switches to provide a capacitance to the transmission line.

21. The computer readable medium of claim 16, wherein:

the transmission line comprises at least one of a three dimensional configuration or a planar configuration.

* * * * *